US007871870B2

(12) United States Patent
Mostarshed et al.

(10) Patent No.: US 7,871,870 B2
(45) Date of Patent: Jan. 18, 2011

(54) METHOD OF FABRICATING GATE CONFIGURATIONS FOR AN IMPROVED CONTACTS IN NANOWIRE BASED ELECTRONIC DEVICES

(75) Inventors: Shahriar Mostarshed, San Mateo, CA (US); Jian Chen, Sunnyvale, CA (US); Francisco A. Leon, Palo Alto, CA (US); Yaoling Pan, East Windsor, NJ (US); Linda T. Romano, Sunnyvale, CA (US)

(73) Assignee: Nanosys, Inc., Palo Alto, CA (US)

( * ) Notice: Subject to any disclaimer, the term of this patent is extended or adjusted under 35 U.S.C. 154(b) by 0 days.

(21) Appl. No.: 12/703,043

(22) Filed: Feb. 9, 2010

(65) Prior Publication Data

US 2010/0144103 A1  Jun. 10, 2010

Related U.S. Application Data

(62) Division of application No. 12/244,573, filed on Oct. 2, 2008, now Pat. No. 7,701,014, which is a division of application No. 11/233,398, filed on Sep. 22, 2005, now Pat. No. 7,473,943.

(60) Provisional application No. 60/618,762, filed on Oct. 15, 2004.

(51) Int. Cl.
*H01L 21/00* (2006.01)
*H01L 27/108* (2006.01)

(52) U.S. Cl. .................. 438/151; 438/585; 257/296; 257/368; 257/E51.006

(58) Field of Classification Search .......... None
See application file for complete search history.

(56) References Cited

U.S. PATENT DOCUMENTS 5,612,255 A   3/1997   Chapple-Sokol et al.

(Continued)

FOREIGN PATENT DOCUMENTS

WO   0103208   1/2001

(Continued)

OTHER PUBLICATIONS

Chung, S-W et al., "Silicon nanowire devices" Am. Inst. Phys. (2000) 76(15):2068-2070.

(Continued)

*Primary Examiner*—Alonzo Chambliss
(74) *Attorney, Agent, or Firm*—Andrew L. Filler

(57) ABSTRACT

Methods, systems, and apparatuses for electronic devices having improved gate structures are described. An electronic device includes at least one nanowire. A gate contact is positioned along at least a portion of a length of the at least one nanowire. A dielectric material layer is between the gate contact and the at least one nanowire. A source contact and a drain contact are in contact with the at least one nanowire. At least a portion of the source contact and/or the drain contact overlaps with the gate contact along the nanowire the length. In another aspect, an electronic device includes a nanowire having a semiconductor core surrounded by an insulating shell layer. A ring shaped first gate region surrounds the nanowire along a portion of the length of the nanowire. A second gate region is positioned along the length of the nanowire between the nanowire and the substrate. A source contact and a drain contact are coupled to the semiconductor core of the nanowire at respective exposed portions of the semiconductor core.

21 Claims, 17 Drawing Sheets

U.S. PATENT DOCUMENTS

| | | | |
|---|---|---|---|
| 5,920,078 | A | 7/1999 | Frey |
| 5,962,863 | A | 10/1999 | Russell et al. |
| 6,256,767 | B1 | 7/2001 | Kuekes et al. |
| 6,274,007 | B1 | 8/2001 | Smirnov et al. |
| 6,438,025 | B1 | 8/2002 | Skarupo |
| 6,447,663 | B1 | 9/2002 | Lee et al. |
| 6,465,813 | B2 | 10/2002 | Ihm |
| 6,566,704 | B2 | 5/2003 | Choi et al. |
| 6,586,785 | B2 | 7/2003 | Flagan et al. |
| 6,672,925 | B2 | 1/2004 | Talin et al. |
| 6,706,566 | B2 | 3/2004 | Avouris et al. |
| 6,760,245 | B2 | 7/2004 | Eaton et al. |
| 6,790,425 | B1 | 9/2004 | Smalley et al. |
| 6,798,000 | B2 | 9/2004 | Luyken et al. |
| 6,815,218 | B1 | 11/2004 | Jacobson et al. |
| 6,903,717 | B2 | 6/2005 | Takahashi et al. |
| 7,067,867 | B2 | 6/2006 | Duan et al. |
| 7,135,728 | B2 | 11/2006 | Duan et al. |
| 7,323,730 | B2 | 1/2008 | Borghetti et al. |
| 7,473,943 | B2 | 1/2009 | Mostarshed |
| 7,701,014 | B2 * | 4/2010 | Mostarshed et al. ......... 257/368 |
| 2002/0038894 | A1 | 4/2002 | Haematsu |
| 2002/0117659 | A1 | 8/2002 | Lieber et al. |
| 2002/0127495 | A1 | 9/2002 | Scherer |
| 2002/0130311 | A1 | 9/2002 | Lieber et al. |
| 2002/0130353 | A1 | 9/2002 | Lieber et al. |
| 2002/0163079 | A1 | 11/2002 | Awano |
| 2002/0173083 | A1 | 11/2002 | Avouris et al. |
| 2002/0175408 | A1 | 11/2002 | Majumdar et al. |
| 2003/0012723 | A1 | 1/2003 | Clarke |
| 2003/0042562 | A1 | 3/2003 | Giebeler et al. |
| 2003/0089899 | A1 | 5/2003 | Lieber et al. |
| 2003/0098488 | A1 | 5/2003 | O'Keeffe et al. |
| 2003/0186522 | A1 | 10/2003 | Duan et al. |
| 2003/0189202 | A1 | 10/2003 | Li et al. |
| 2004/0005258 | A1 | 1/2004 | Fonash et al. |
| 2004/0031975 | A1 | 2/2004 | Kern et al. |
| 2004/0036126 | A1 | 2/2004 | Chau et al. |
| 2004/0036128 | A1 | 2/2004 | Zhang et al. |
| 2004/0061422 | A1 | 4/2004 | Avouris et al. |
| 2004/0192072 | A1 | 9/2004 | Snow et al. |
| 2004/0213307 | A1 | 10/2004 | Lieber et al. |
| 2004/0238887 | A1 | 12/2004 | Nihey |
| 2005/0064618 | A1 | 3/2005 | Brown et al. |

FOREIGN PATENT DOCUMENTS

| | | |
|---|---|---|
| WO | 0217362 | 2/2002 |
| WO | 0248701 | 6/2002 |

OTHER PUBLICATIONS

Duan, X. et al., "High performance thin-film transistors using semiconductor nanowires and nanoribbons" Nature (2003) 425:274-278.

Martel, R. et al. "Single- and multi-wall carbon nanotube field-effect transistors" Appl. Phys. Letts (1998) 73(17):2447-2449.

Tans, S.J. et al., "Room-temperature transistor based on a single carbon nanotube" Nature (1998) 393:49-52.

Yamada, T. "Analysis of submicron carbon nanotube field-effect transistors" Appl. Phys Letts (2000) 76(5):628-630.

* cited by examiner

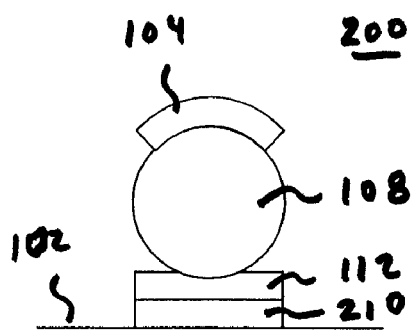
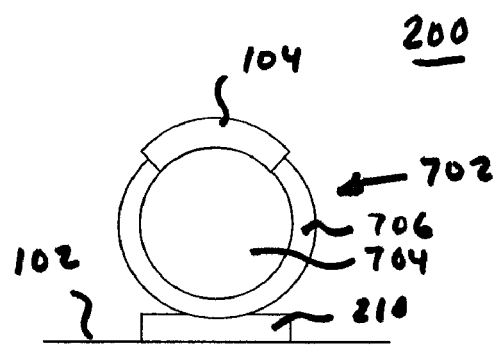
FIG. 7A  FIG. 7B
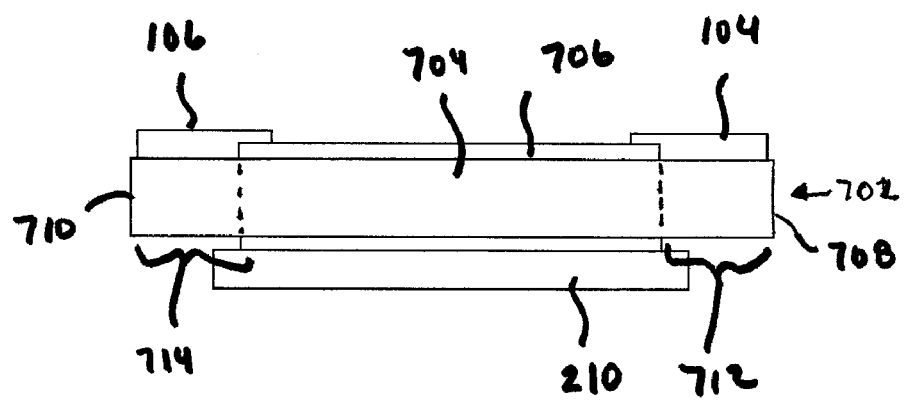
FIG. 7C

METHOD OF FABRICATING GATE CONFIGURATIONS FOR AN IMPROVED CONTACTS IN NANOWIRE BASED ELECTRONIC DEVICES

CROSS-REFERENCE TO RELATED APPLICATIONS

This application is a divisional of U.S. patent application Ser. No. 12/244,573, filed Oct. 2, 2008, which is a divisional of U.S. patent application Ser. No. 11/233,398, filed Sep. 22, 2005, now U.S. Pat. No. 7,473,943, which claims priority to U.S. Provisional Patent Application No. 60/618,762, filed Oct. 15, 2004, which is incorporated herein in its entirety.

BACKGROUND OF THE INVENTION

1. Field of the Invention

The present invention relates to gating configurations in nanowire-based electronic devices.

2. Background Art

An interest exists in industry in developing low cost electronics, and in particular, in developing low cost, large area electronic devices. Availability of such large area electronic devices could revolutionize a variety of technology areas, ranging from civil to military applications. Example applications for such devices include driving circuitry for active matrix liquid crystal displays (LCDs) and other types of matrix displays, smart libraries, credit cards, radio-frequency identification tags for smart price and inventory tags, security screening/surveillance or highway traffic monitoring systems, large area sensor arrays, and the like.

Accordingly, what is needed are higher performance conductive or semiconductive materials and devices, and methods and systems for producing lower-cost, high performance electronic devices and components.

Furthermore, what is needed are high performance semiconductor devices, such as thin film transistors (TFTs), that can be applied to plastics and other substrates requiring low process temperatures.

BRIEF SUMMARY OF THE INVENTION

Methods, systems, and apparatuses for forming high performance electronic devices are described. For example, methods, systems, and apparatuses for semiconductor devices having improved gate structures are described.

In an aspect of the present invention, an electronic device includes one or more nanowires. A gate contact is positioned along at least a portion of a length of the nanowire(s). A dielectric material layer is between the gate contact and the nanowire(s). A source contact and a drain contact are formed with the nanowire(s). At least a portion of the source contact and/or the drain contact overlaps with the gate contact along the length of the nanowire(s).

In another aspect of the present invention, electronic devices with double gate structures are described. In one aspect, the double gate structure includes a front gate and a back gate structure.

In a further aspect, the double gate structures are asymmetrical.

In a further aspect, electronic devices having a gate structure that encircles a nanowire is described.

In an aspect, an electronic device includes a nanowire having a semiconductor core surrounded by an insulating shell layer. A ring shaped first gate region surrounds the nanowire along a portion of the length of the nanowire. A second gate region is positioned along the length of the nanowire between the nanowire and a supporting substrate. A source contact and a drain contact are coupled to the semiconductor core of the nanowire at respective exposed portions of the semiconductor core.

In further aspects of the present invention, methods for fabricating these electronic devices are described.

According to aspects of the present invention, nanowire, nanorod, nanoparticle, nanoribbon, and nanotube configurations and thin films incorporating improved gate structures enable a variety of new capabilities. In aspects, these include: moving microelectronics from single crystal substrates to glass and plastic substrates; integrating macroelectronics, microelectronics and nanoelectronics at the device level; and, integrating different semiconductor materials on a single substrate. These aspects of the present invention impact a broad range of existing applications, from flat-panel displays to image sensor arrays, and enable a whole new range of universal flexible, wearable, disposable electronics for computing, storage and communication, flash memory devices, and other types of memory devices, printing devices, etc.

These and other objects, advantages and features will become readily apparent in view of the following detailed description of the invention.

BRIEF DESCRIPTION OF THE DRAWINGS/FIGURES

The accompanying drawings, which are incorporated herein and form a part of the specification, illustrate the present invention and, together with the description, further serve to explain the principles of the invention and to enable a person skilled in the pertinent art to make and use the invention.

FIG. 7A shows an end view of the nanowire-based electronic device of FIG. 2B, according to an example embodiment of the present invention.

FIG. 7B shows an electronic device that includes a core-shell nanowire, according to an embodiment of the present invention.

FIG. 7C shows a side cross-sectional view of the electronic device of FIG. 7B, according to an example embodiment of the present invention.

Figure 1:
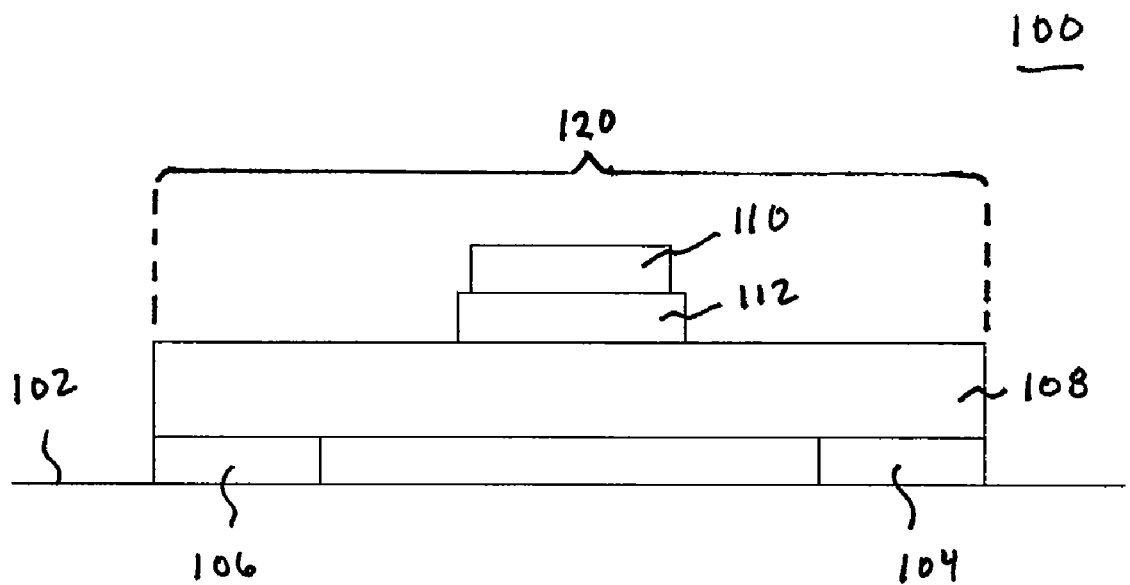
FIG. 1 shows an example nanowire-based electronic device on a substrate.

The present invention will now be described with reference to the accompanying drawings. In the drawings, like reference numbers indicate identical or functionally similar elements. Additionally, the left-most digit(s) of a reference number identifies the drawing in which the reference number first appears.

DETAILED DESCRIPTION OF THE INVENTION

Introduction

It should be appreciated that the particular implementations shown and described herein are examples of the invention and are not intended to otherwise limit the scope of the present invention in any way. Indeed, for the sake of brevity, conventional electronics, manufacturing, semiconductor devices, and nanowire (NW) technologies and other functional aspects of the systems (and components of the individual operating components of the systems) may not be described in detail herein. Furthermore, for purposes of brevity, the invention is frequently described herein as pertaining to nanowires, and to a semiconductor transistor device. Moreover, while the number of nanowires and spacing of those nanowires are provided for the specific implementations discussed, the implementations are not intended to be limiting and a wide range of the number of nanowires and spacing can also be used. It should be appreciated that although nanowires are frequently referred to, the techniques described herein are also applicable to nanorods, nanotubes, and nanoribbons. It should further be appreciated that the manufacturing techniques described herein could be used to create any semiconductor device type, and other electronic component types. Further, the techniques would be suitable for application in electrical systems, optical systems, consumer electronics, industrial electronics, wireless systems, space applications, or any other application.

As used herein, the term "nanowire" generally refers to any elongated conductive or semiconductive material (or other material described herein) that includes at least one cross sectional dimension that is less than 500 nm, and preferably, less than 100 nm, and has an aspect ratio (length:width) of greater than 10, preferably greater than 50, and more preferably, greater than 100. Examples of such nanowires include semiconductor nanowires as described in Published International Patent Application Nos. WO 02/17362, WO 02/48701, and WO 01/03208, carbon nanotubes, and other elongated conductive or semiconductive structures of like dimensions.

As used herein, the term "nanorod" generally refers to any elongated conductive or semiconductive material (or other material described herein) similar to a nanowire, but having an aspect ratio (length:width) less than that of a nanowire.

Note that two or more nanorods can be coupled together along their longitudinal axis so that the coupled nanorods span all the way between any two or more points, such as contacts or electrodes. Alternatively, two or more nanorods can be substantially aligned along their longitudinal axis, but not coupled together, such that a small gap exists between the ends of the two or more nanorods. In this case, electrons can flow from one nanorod to another by hopping from one nanorod to another to traverse the small gap. The two or more nanorods can be substantially aligned, such that they form a path by which electrons can travel between electrodes.

As used herein, the term "nanoparticle" generally refers to any conductive or semiconductive material (or other material described herein) similar to a nanowire/nanorod, but having an aspect ratio (length:width) less than that of a nanorod, including an aspect ratio of 1:1. Note that two or more nanoparticles can be coupled together so that the coupled nanoparticles span all the way between any two or more points, such as contacts or electrodes. Alternatively, two or more nanoparticles can be substantially aligned, but not coupled together, such that a small gap exists between them. In this case, electrons can flow from one nanoparticle to another by hopping from one nanoparticle to another to traverse the small gap. The two or more nanoparticles can be substantially aligned (e.g., chemically, by electrical charge/electrical field, etc.), such that they form a path by which electrons can travel between electrodes. Note that a "nanoparticle" can be referred to as a "quantum dot."

While the example implementations described herein principally use CdS and Si, other types of materials for nanowires and nanoribbons can be used, including semiconductive nanowires or nanoribbons, that are comprised of semiconductor material selected from, e.g., Si, Ge, Sn, Se, Te, B, C (including diamond), P, B—C, B—P(BP6), B—Si, Si—C, Si—Ge, Si—Sn and Ge—Sn, SiC, BN/BP/BAs, AlN/AlP/AlAs/AlSb, GaN/GaP/GaAs/GaSb, InN/InP/InAs/InSb, BN/BP/BAs, AlN/AlP/AlAs/AlSb, GaN/GaP/GaAs/GaSb, InN/InP/InAs/InSb, ZnO/ZnS/ZnSe/ZnTe, CdS/CdSe/CdTe, HgS/HgSe/HgTe, BeS/BeSe/BeTe/MgS/MgSe, GeS, GeSe, GeTe, SnS, SnSe, SnTe, PbO, PbS, PbSe, PbTe, CuF, CuCl, CuBr, CuI, AgF, AgCl, AgBr, AgI, BeSiN2, $CaCN_2$, $ZnGeP_2$, $CdSnAs_2$, $ZnSnSb_2$, $CuGeP_3$, $CuSi_2P_3$, $(Cu, Ag)(Al, Ga, In, Tl, Fe)(S, Se, Te)_2$, $Si_3N_4$, $Ge_3N_4$, $Al_2O_3$, $(Al, Ga, In)_2 (S, Se, Te)_3$, $Al_2CO$, and an appropriate combination of two or more such semiconductors.

In certain aspects, the semiconductor may comprise a dopant from a group consisting of: a p-type dopant from Group III of the periodic table; an n-type dopant from Group V of the periodic table; a p-type dopant selected from a group consisting of: B, Al and In; an n-type dopant selected from a group consisting of: P, As and Sb; a p-type dopant from Group II of the periodic table; a p-type dopant selected from a group consisting of: Mg, Zn, Cd and Hg; a p-type dopant from Group IV of the periodic table; a p-type dopant selected from a group consisting of: C and Si; or an n-type dopant selected from a group consisting of: Si, Ge, Sn, S, Se and Te.

Additionally, the nanowires or nanoribbons can include carbon nanotubes, or nanotubes formed of conductive or semiconductive organic polymer materials, (e.g., pentacene, and transition metal oxides).

Hence, although the term "nanowire" is referred to throughout the description herein for illustrative purposes, it is intended that the description herein also encompass the use of nanotubes (e.g., nanowire-like structures having a hollow tube formed axially therethrough). Nanotubes can be formed in combinations/thin films of nanotubes as is described herein for nanowires, alone or in combination with nanowires, to provide the properties and advantages described herein.

Furthermore, it is noted that a thin film of nanowires of the present invention can be a "heterogeneous" film, which incorporates semiconductor nanowires and/or nanotubes, and/or nanorods, and/or nanoribbons, and/or any combination thereof of different composition and/or structural characteristics. For example, a "heterogeneous film" can includes nanowires/nanotubes with varying diameters and lengths, and nanotubes and/or nanotubes that are "heterostructures" having varying characteristics.

In the context of the invention, although the focus of the detailed description relates to use of nanowire, nanorod, nanotube, or nanoribbon thin films on semiconductor substrates, the substrate to which these nano structures are attached may comprise any materials, including, but not limited to: a uniform substrate, e.g., a wafer of solid material, such as silicon or other semiconductor material, glass, quartz, polymerics, etc.; a large rigid sheet of solid materials, e.g., glass, quartz, plastics such as polycarbonate, polystyrene, etc., or can comprise additional elements, e.g., structural, compositional, etc. Alternatively, a flexible substrate can be employed, such as a roll of plastic such as polyolefins, polyamide, and others, a transparent substrate, or combinations of these features. For example, the substrate may include other circuit or structural elements that are part of the ultimately desired device. Particular examples of such elements include electrical circuit elements such as electrical contacts, other wires or conductive paths, including nanowires or other nanoscale conducting elements, optical and/or optoelectrical elements (e.g., lasers, LEDs, etc.), and structural elements (e.g., microcantilevers, pits, wells, posts, etc.).

By substantially "aligned" or "oriented" is meant that the longitudinal axes of a majority of nanowires in a collection or population of nanowires is oriented within 30 degrees of a single direction. Although the majority can be considered to be a number of nanowires greater than 50%, in various embodiments, 60%, 75%, 80%, 90%, or other percentage of nanowires can be considered to be a majority that are so oriented. In certain preferred aspects, the majority of nanowires are oriented within 10 degrees of the desired direction. In additional embodiments, the majority of nanowires may be oriented within other numbers or ranges of degrees of the desired direction.

It should be understood that the spatial descriptions (e.g., "above", "below", "up", "down", "top", "bottom", etc.) made herein are for purposes of illustration only, and that devices of the present invention can be spatially arranged in any orientation or manner.

Electronic Device Embodiments Having Overlapping Gates

Embodiments of the present invention are provided in this section for electronic devices having overlapping gate configurations. These embodiments are provided for illustrative purposes, and are not limiting. Additional operational and structural embodiments for the present invention will be apparent to persons skilled in the relevant art(s) from the description herein. These additional embodiments are within the scope and spirit of the present invention.

For example, embodiments of the present invention apply to transistors such as field-effect transistors (FETs), including metal-oxide semiconductor FETs (MOSFETs). A FET is a three-terminal device in which the current between first and second terminals is controlled at a third terminal. For example, a voltage can be applied at the third terminal to control the current. In an embodiment, the first and second terminals may be "source" and "drain" terminals, and the third terminal may be a "gate" terminal. In an embodiment, the three terminals are formed in or on a semiconductor material.

In a MOSFET embodiment, a metal gate electrode is typically separated from the semiconductor material by an insulator material. The regions of the semiconductor material corresponding to the source and drain are typically doped differently from the base semiconductor material. For example, the source and drain regions may be "n" doped, while the base semiconductor material is "p" doped (i.e., an "n-channel" device). Alternatively, the source and drain regions may be "p" doped, while the base semiconductor material is "n" doped (i.e., a "p-channel" device). A voltage applied at the gate forms a depletion region, and further creates a thin surface region containing mobile carriers, called a channel region. An n-channel device has electrons for the majority carrier, while a p-channel device as holes for the majority carrier. Formation of the channel region allows current to flow between the source and drain.

According to embodiments of the present invention, the gate contact is overlapped with the source and/or drain regions of the nanowire (or plurality of nanowires). This configuration allows improved Ohmic (low resistance) contact to intrinsic and low-doped semiconductor nanowires to be formed.

The conventional approach to making an Ohmic contact between a metal and a semiconductor is to implant dopants in the regions where the metal is to come into contact with the semiconductor. Such doping can reduce contact resistance and/or series resistance, for example.

For nanowires, very low dopant energies must be used during doping in order to have a shallow junction (e.g., less than 40 nm, for example). Otherwise, higher energy ions may penetrate through the nanowire and cause crystalline structure damage, which the thermal annealing processes may not be able to repair because of the small size of the nanowire and the availability of seed crystalline structure.

Embodiments of the present invention use the gate not only to modulate the channel region of the FET structure, but also, to "turn on" the source and drain regions of the FET nanowire. This is possible because of the small (e.g., sub-100 nm) dimensions of the nanowires involved. Although a nanowire is accumulated/inverted under the influence of the gate electric field, the drain to source bias also influences the carrier concentration. This is because the small diameter (e.g., sub-100 nm) of the nanowire allows carriers to move around within the nanowire over these small distances by diffusion. This intrinsic nature of the nanowire makes the connections to the drain and source contacts (e.g., metals) poor, even shutting off the electronic device completely, in the absence of an overlapping gate bias in connection with the present invention. A single gate with overlap of the drain and source areas can modulate the carrier concentration in much the same way as it does within the channel area of the nanowire FET. As a result, the contacts to the drain and source regions do not have to be doped. This is facilitated by the small nanowire diameter (compared to a diffusion length of carriers in silicon, e.g.), and the ability of carriers to diffuse from the gate side of the nanowire to the source and/or drain side of the nanowire to form an extension to the channel.

The present invention is applicable to many types of nanowire-based electronic devices, including nanowire-based transistors. For example, in FET embodiments using this configuration, the gate contact causes charge accumulation or inversion in the source and drain contact areas while also modulating the channel conductance (through the nanowire).

In an embodiment, the gate metal is overlapped with the source and/or drain regions of a nanowire on a surface opposite of that on which the source and drain contacts are located. However, other gate and source/drain arrangements are also possible according to embodiments of the present invention, as would be understood by persons skilled in the relevant art(s) from the teachings herein.

These embodiments provide many advantages, including:
1. Removing a need for doping implant of the contact regions of the nanowires; and
2. Because modulation of the gate into the "off"-state (e.g., where the channel is relatively non-conductive) also turns off the source and drain contact regions, the sub-threshold leakage ("off"-state leakage) is substantially reduced.

FIG. 1 shows an example nanowire-based electronic device 100 on a substrate 102. Electronic device 100 in FIG. 1 is a transistor. As shown in FIG. 1, electronic device 100 has a drain contact 104, a source contact 106, a nanowire 108, a gate contact 110, and a dielectric material layer 112. Electronic device 100 is a conventional electronic device because neither of drain contact 104 and source contact 106 overlap with gate contact 110 along a length 120 of nanowire 108. Thus, electronic device 100 suffers from the deficiencies noted above.

Figure 2A:
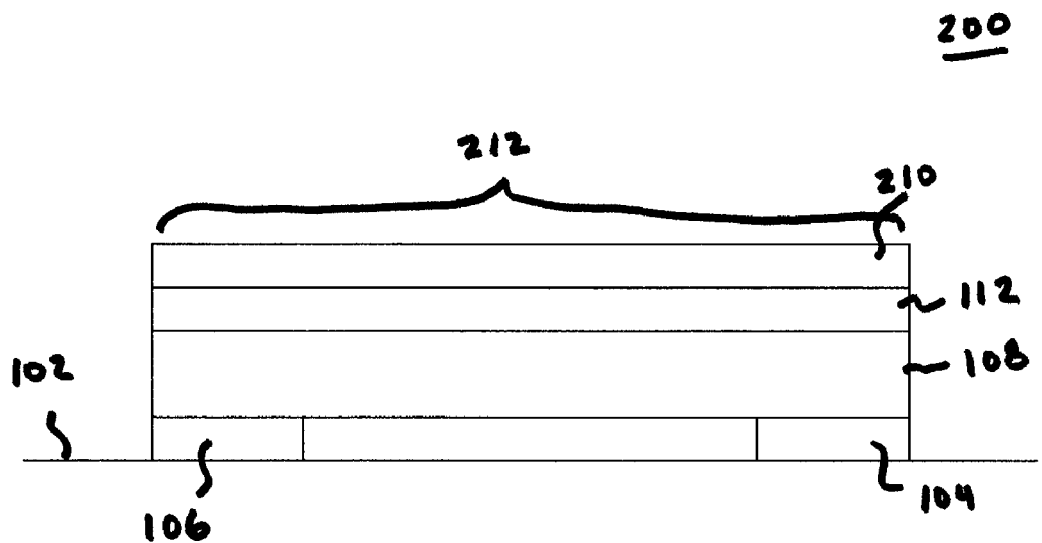
FIGS. 2A and 2B show example nanowire-based electronic devices with overlapping gate structures, according to embodiments of the present invention.
Figure 2B:
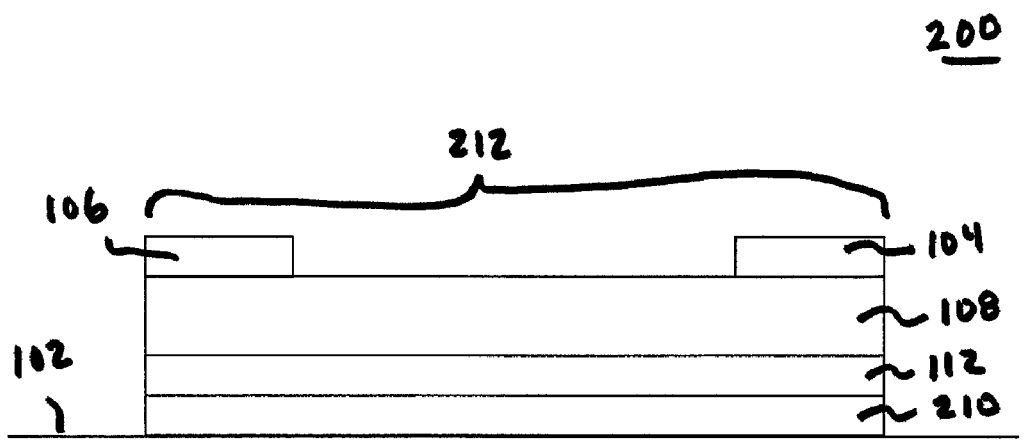

FIGS. 2A and 2B show example nanowire-based electronic devices on substrate 102, according to embodiments of the present invention. FIG. 2A shows an electronic device 200, having drain electrode or contact 104, source electrode or contact 106, nanowire 108, a gate electrode or contact 210, and dielectric material layer 112.

Figure 3:
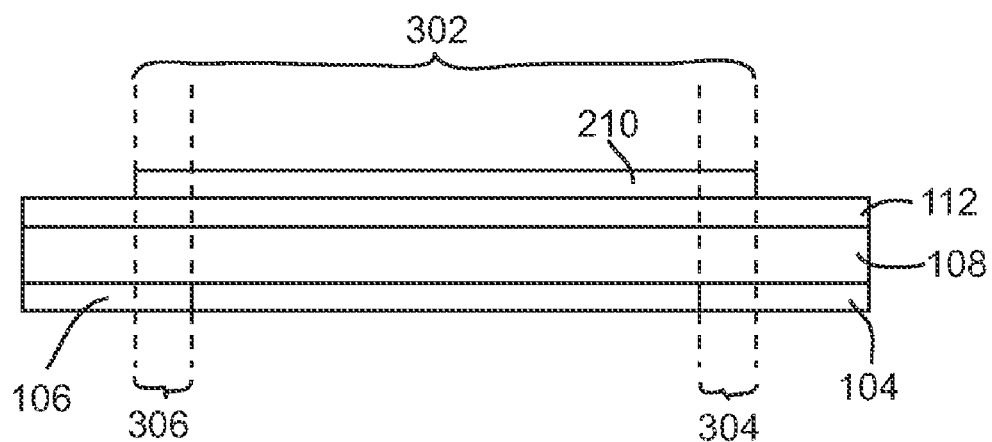
FIG. 3 shows a gate contact spanning a portion of the length of a nanowire.

As shown in FIG. 2A, gate contact 210 is positioned along the length 212 of nanowire 108. In alternative embodiments, gate contact 210 can be formed along any portion of length 212 of nanowire 108. For example, FIG. 3 shows gate contact 210 positioned along a portion 302, which is less than the entire length of nanowire 108.

Dielectric material layer 112 is positioned between gate contact 210 and nanowire 108. Dielectric material layer 112 functions as a gate dielectric, and can be any type of dielectric material, including organic or inorganic, and can be spun on, sputtered, or applied by any other thin film deposition methods, such as chemical vapor deposition (CVD), e-beam evaporation, or applied in any other manner described or referenced elsewhere herein, or otherwise known. In an embodiment, the dielectric material can be recessed in the channel area to give better coupling efficiency in the channel area.

Drain contact 104 is in contact with nanowire 108. As shown in FIG. 2A, drain contact 104 overlaps with gate contact 210. In other words, drain contact 104 overlaps with the portion of nanowire 108 along which gate contact 210 is positioned. Source contact 106 is in contact with nanowire 108. As shown in FIG. 2A, source contact 106 overlaps with gate contact 210. In other words, source contact 106 overlaps with the portion of nanowire 108 along which gate contact 210 is positioned.

As shown in FIGS. 2A and 2B, the entire length of drain contact 104 and source contact 106 overlap with length 212 of nanowire 108. Alternatively, as shown in FIG. 3, a portion 306 of source contact 106 overlaps with gate contact 210, and a portion 304 of drain contact 104 overlaps with gate contact 210. In an embodiment, an amount of overlap of either or both of drain contact 104 and source contact 106 with gate contact 210 is minimized to reduce parasitic capacitance(s).

Because of the overlap with gate contact 210, the regions of nanowire 108 adjacent to drain contact 104 and source contact 106 do not need to be doped to create Ohmic contacts. Gate contact 210 can be used to modulate the carrier concentration in these regions, due to the overlap, to "turn on" the source and drain regions of nanowire 108.

Gate contact 210, drain contact 104, and source contact 106 can be any suitable conductive material, including organic (conducting polymers) or inorganic (e.g., a metal or combination of metals/alloy) and can be painted, electroplated, evaporated, sputtered, spun on, or applied as described or reference elsewhere herein, or otherwise known.

Note that a space 220 between drain contact 104 and source contact 106, when present, can be filled or unfilled. For example, space 220 may include air, an insulating material, an adhesive that attaches nanowire 108 to substrate 102, or any other suitable material, as would be known to persons skilled in the relevant art(s).

Electronic device 200 may be formed using conventional processes, and can be formed in any order. For example, as shown in FIG. 2A, source contact 104 and drain contact 106 are formed on substrate 102. Nanowire 108 is deposited or otherwise positioned on source contact 104 and drain contact 106. Dielectric material layer 112 is formed on nanowire 108. Gate contact 210 is formed on dielectric material layer 112.

Alternatively, gate contact 210 can be formed on a substrate for electronic device 200. For example, as shown in FIG. 2B, gate contact 210 is formed on substrate 102. Dielectric material layer 112 is formed on gate contact 210. Nanowire 108 is deposited or otherwise positioned on dielectric material layer 112. Source contact 106 and drain contact 104 are formed on nanowire 108.

Figure 4:
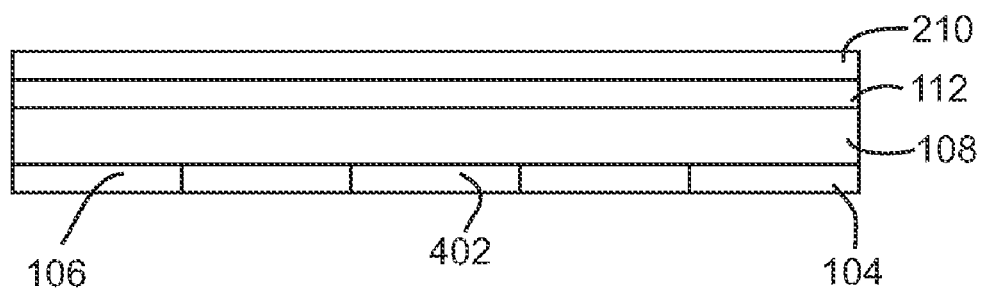
FIG. 4 shows an electronic device having a double gate, according to an embodiment of the present invention.

During operation of electronic device 200 as a FET, nanowire 108 functions as a channel between source and drain contacts 106 and 104. In embodiments, one or more additional gate contacts, global or local, can be formed in electronic device 200 to enhance performance. For example, as shown in FIG. 4, a second gate contact 402 can be present in electronic device 200, according to an embodiment. Second gate 402 can be coupled to, or isolated from first gate contact 210. In the configuration shown in FIG. 4, second gate contact 402 may be referred to as a "back" gate, while first gate contact 210 may be referred to as a "front" gate. Second gate contact 402 can improve the channel conductance. Multi-gate configurations other than shown in FIG. 4 are also applicable to embodiments of the present invention, as would be understood by persons skilled in the relevant art(s) from the teachings herein.

Figure 5:
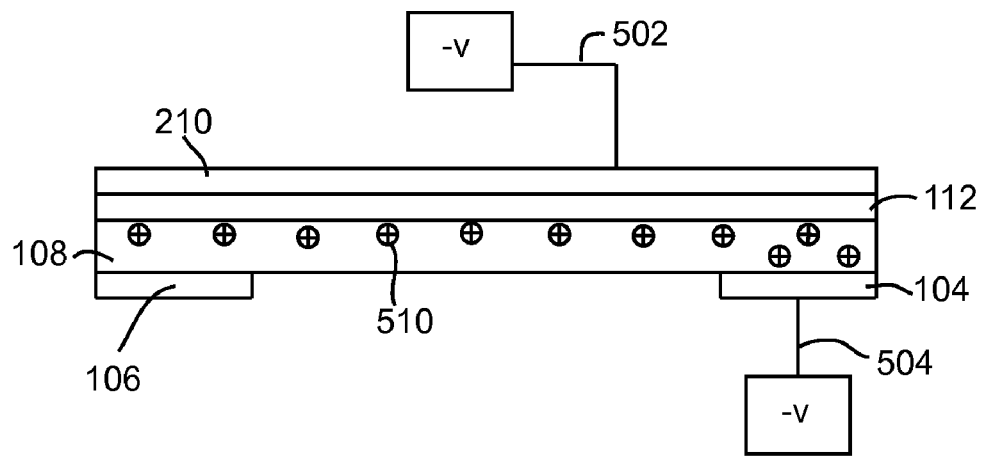
FIGS. 5 and 6 show example operation of the nanowire-based electronic devices of FIGS. 2A and 2B, according to embodiments of the present invention.
Figure 6:
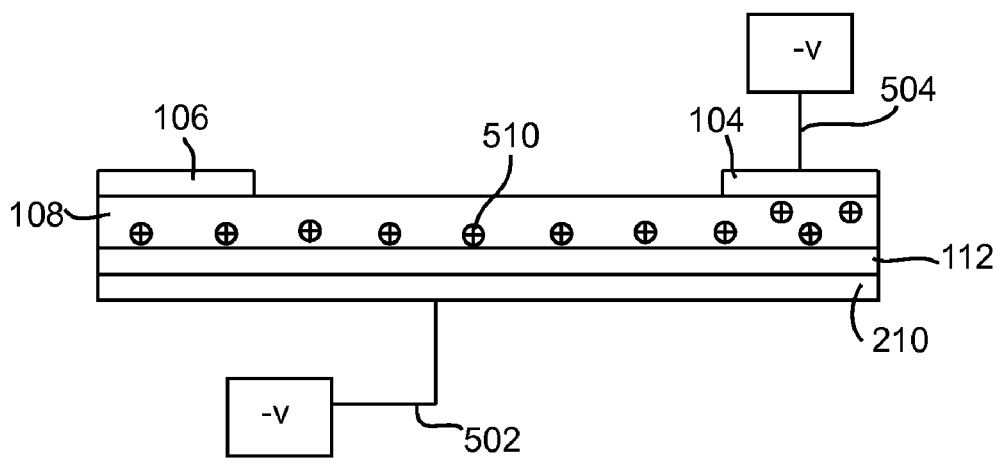

FIGS. 5 and 6 show example operation of electronic devices 200 of FIGS. 2A and 2B. In the examples of FIGS. 5 and 6, nanowire 108 is a p-type semiconductor material. In alternative embodiments, nanowire 108 can be n-type. For example, FIG. 5 shows a first negative voltage signal 502 coupled to gate contact 210, and a second negative voltage signal 504 applied to drain contact 104. Source contact 106 can be coupled to a ground or other voltage or potential. As shown in the example of FIG. 5, application of a negative voltage to gate contact 210 causes positive charge 510 to accumulate in nanowire 108 near gate contact 210 to form a channel, with additional positive charge accumulating near drain contact 104. Electronic device 200 shown in FIG. 6 operates in a similar manner to electronic device 200 shown in FIG. 5.

In an embodiment, such as shown in FIGS. 2A and 2B, dielectric material layer 112 is deposited. For example, FIG. 7A shows an end view of electronic device 200, where dielectric material layer 112 is formed on gate contact 210 on substrate 102. In another embodiment, dielectric material layer 112 can be a shell layer of nanowire 108. For example, FIG. 7B shows electronic device 200 having a core-shell nanowire 702, according to an embodiment of the present invention. Nanowire 702 has a semiconductor core 704 surrounded by shell layer 706. Shell layer 706 is a dielectric material formed in a surface of nanowire 702, or applied thereto. In the example embodiment of FIG. 7B, core-shell nanowire 702 is deposited on gate contact 210, and drain contact 104 (and source contact 106, not shown in FIG. 7B) is formed on nanowire 702. Shell layer 706 functions as dielectric material layer 112 for electronic device 200 of FIG. 7B. Alternatively, gate contact 210 can be formed on nanowire 702, and drain contact 104 (and source contact 106) can be formed on substrate 102.

Note that in the embodiment shown in FIG. 7B, a portion of shell layer 706 is not present so that drain contact 104 (and source contact 106) can be in contact with core 704. For example, FIG. 7C shows a side cross-sectional view of electronic device 200 of FIG. 7B, according to an example embodiment of the present invention. As shown in FIG. 7C, portions 712 and 714 of shell layer 706 at the ends 708 and 710 of nanowire 702 can be patterned/removed to expose core 704 for drain and source contacts 104 and 106.

Note that in embodiments, electronic devices can be formed having any number of one or more nanowires. For example, pluralities of nanowires can be formed into a thin film, and used in electronic devices. When a plurality of nanowires are used, the nanowires can be aligned or non-aligned (e.g., randomly oriented).

Figure 7D:
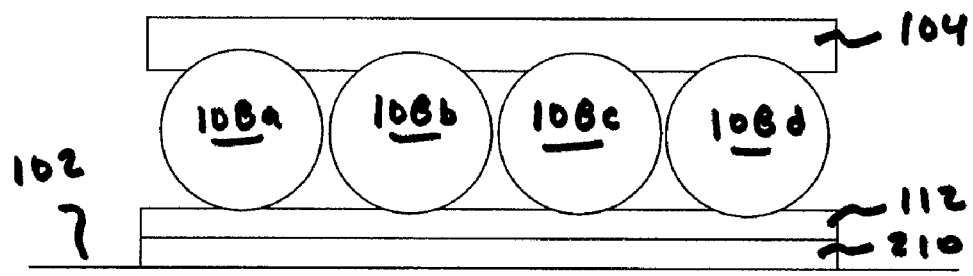
FIGS. 7D and 7E shows end views of electronic devices that include a plurality of nanowires, according to example embodiments of the present invention.

For example, FIG. 7D shows a cross-sectional end view of an electronic device 750, having a plurality of aligned nanowires 108a-108d, according to an example embodiment of the present invention. As shown in the example of FIG. 7D, plurality of nanowires 108a-d are deposited on dielectric material layer 112. Furthermore, the plurality of nanowires 108a-d have a common drain contact 104 (and common source contact 106, not shown in FIG. 7D) formed thereon.

Figure 7E:
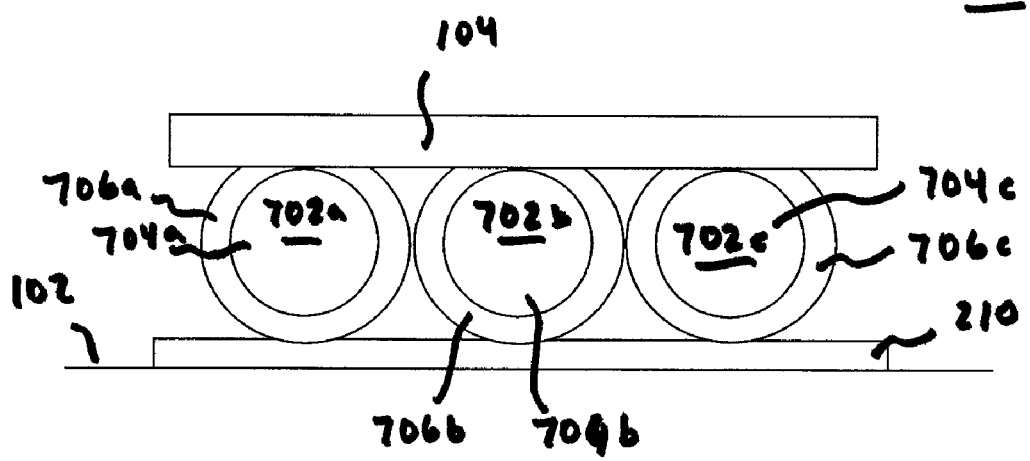

Alternatively, the plurality of nanowires can be core-shell nanowires. For example, FIG. 7E shows a cross-sectional end view of an electronic device 760, having a plurality of aligned core-shell nanowires 702a-702c, according to an example embodiment of the present invention. As shown in the example of FIG. 7E, the plurality of nanowires 702a-c have a common drain contact 104 (and common source contact 106, not shown in FIG. 7D) formed thereon. Drain contact 104 is shown in contact with an exposed portion of cores 704a-c of nanowires 702a-c where a portion of shells 706a-c is removed. Furthermore, plurality of nanowires 108a-d are deposited on gate contact 210.

Note that electronic devices 750 can alternatively have drain and source contacts 104 and 106 formed on substrate 102, and have gate contact 210 formed on the pluralities of nanowires, or can be configured in other ways.

Figure 8:
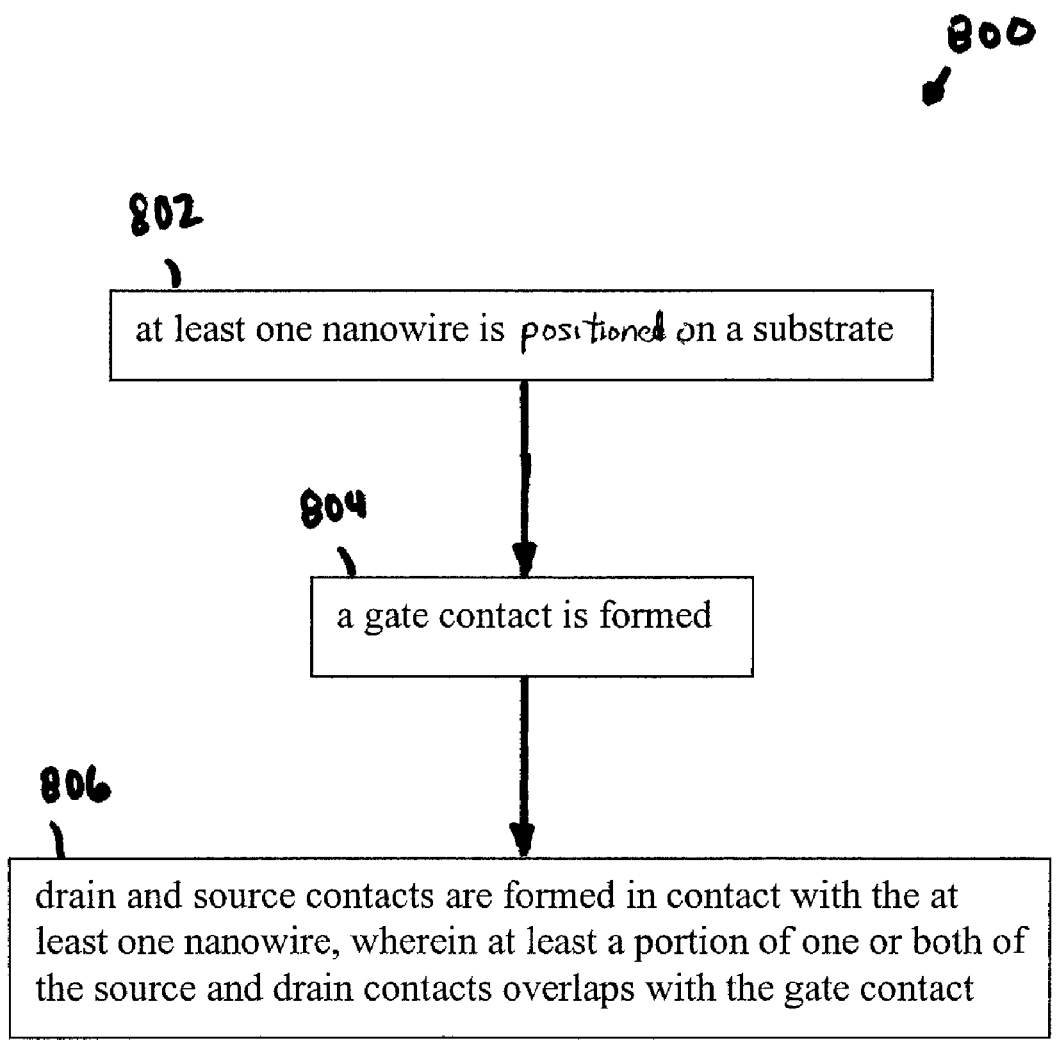
FIG. 8 shows a flowchart providing example steps for fabricating an electronic device, such as shown in FIGS. 2A and 2B, according to an example embodiment of the present invention.

FIG. 8 shows a flowchart 800 providing example steps for fabricating an electronic device, according to an example embodiment of the present invention. Other structural and operational embodiments will be apparent to persons skilled in the relevant art(s) based on the following discussion. The steps shown in FIG. 8 do not necessarily have to occur in the order shown. The steps of FIG. 8 are described in detail below.

Flowchart 800 begins with step 802. In step 802, at least one nanowire is positioned on a substrate. For example, any number of one or more nanowires may be positioned or deposited. For instance, FIGS. 7A and 7B relate to example single nanowire embodiments, and FIGS. 7D and 7E relate to example embodiments where pluralities of nanowires are present. Nanowires such as nanowire 108 shown in FIG. 7A and/or such as nanowire 702 shown in FIG. 7B may be used. Any type of substrate may be used for substrate 102, including flexible and rigid substrates, and small area and large area substrates.

In step 804, a gate contact is formed. The gate contact is positioned along at least a portion of a length of the at least one nanowire, and is separated from the at least one nanowire by a dielectric material layer. For example the gate contact can be gate contact 210, formed after positioning of nanowires (such as shown in FIG. 2A) or formed before positioning of nanowires (such as shown in FIG. 2B).

In step 806, drain and source contacts are formed in contact with the at least one nanowire, wherein at least a portion of one or both of the source and drain contacts overlaps with the gate contact. For example, the drain and source contacts are drain and source contacts 104 and 106 as shown in FIG. 2A or 2B. As shown in FIGS. 2A and 2B, drain and source contacts 104 and 106 entirely overlap with gate contact 210. Alternatively, as shown in FIG. 3, portions of source and drain contacts 106 and 104 overlap with gate contact 210. In an alternative embodiment, only one of drain contact 104 and source contact 106 overlap with gate contact 210 along the length of a nanowire.

Asymmetric Double Gated Nanowire-Based Transistor Embodiments

Embodiments of the present invention are provided in this section for electronic devices having asymmetrical gate configurations. These embodiments are provided for illustrative purposes, and are not limiting. Additional operational and structural embodiments for the present invention will be apparent to persons skilled in the relevant art(s) from the description herein. These additional embodiments are within the scope and spirit of the present invention.

According to embodiments of the present invention, an asymmetric double gate configuration is formed to increase the drive ability for nanowire-based electronic devices, such as transistors. Embodiments for making a nanowire FET having an asymmetric double gate configuration are described herein for illustrative purposes.

The asymmetric double gate configuration of the present invention provides for a high performance electronic device, and simplifies the electronic device fabrication process by eliminating doping processes. Such doping processes typically require ion implantation and high temperature diffusion/annealing processes. Fabrication processes according to embodiments of the present invention can be implemented using very low temperature processes (e.g., less than 100° C.). Electronic device embodiments can be formed on any substrate type, including low temperature substrates (e.g., that cannot sustain high temperature processes) with any size and shape (for example, roll to roll plastic electronics), including glass, plastic, stainless steel, ceramic, or other materials or devices.

By taking advantage of double gates and potentially fully depleted channels in nanowires, high performance devices can be a created at very low cost. Initial device modeling and real device testing show superior device performance. For example, current driving capability can be more than doubled using the double gate of the present invention in comparison to non-double gated devices.

Figure 9A:
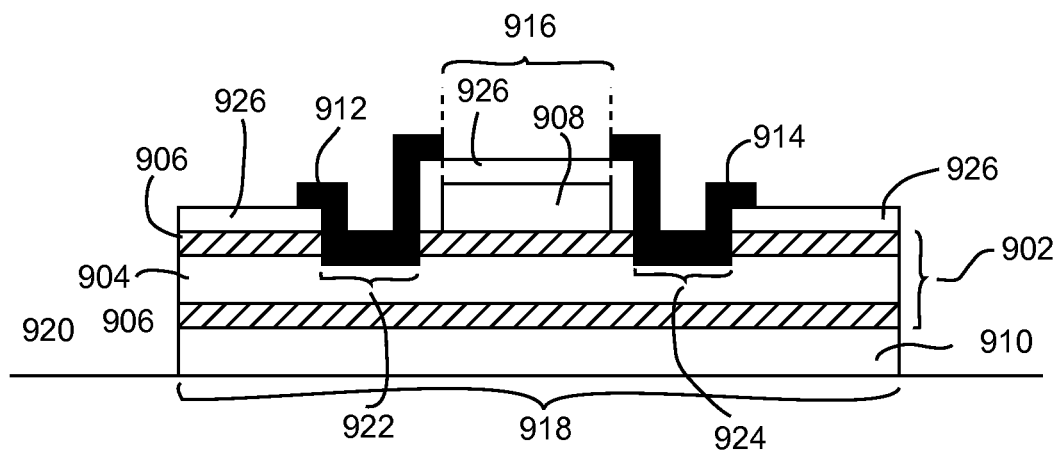
FIG. 9A shows a cross-sectional view of an electronic device having an example asymmetric double gate configuration, according to an embodiment of the present invention.
Figure 9B:
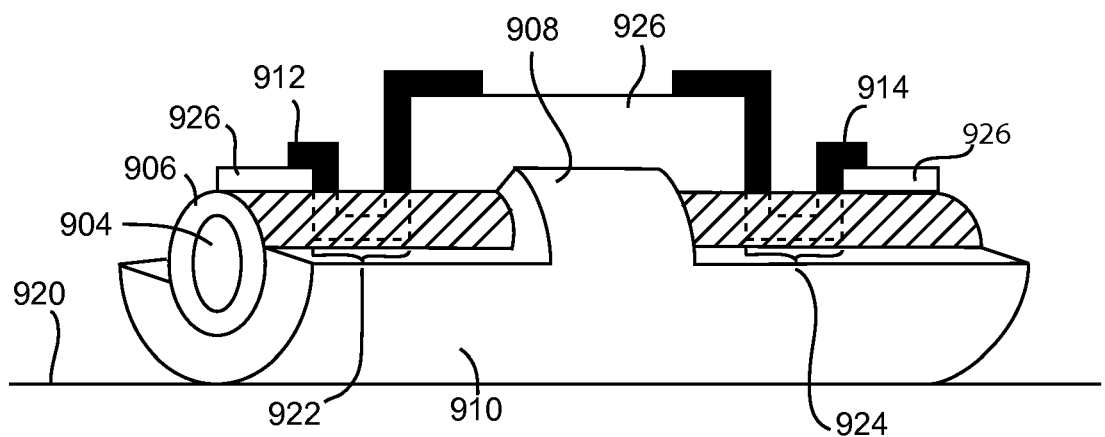
FIG. 9B shows a 3D view of FIG. 9A.

FIG. 9A shows a cross-sectional view and FIG. 9B shows a 3D view of an electronic device 900 having an example asymmetric double gate configuration, according to an embodiment of the present invention. As shown in FIGS. 9A and 9B, electronic device 900 is formed on a substrate 920. Electronic device 900 includes a nanowire 902 having a semiconductor core 904 surrounded by an insulating shell layer 906 (e.g., a conformal coating), a ring shaped first gate region 908, a second gate region 910, a source contact 912, and a drain contact 914.

As will be further described below, ring shaped first gate region 908 surrounds nanowire 902 along a portion 916 of a length 918 of nanowire 902. Second gate region 910 is positioned along the length 918 of nanowire 902 between nanowire 902 and substrate 920.

Source contact 912 and drain contact 914 are coupled to semiconductor core 904 of nanowire 902 at respective exposed portions 922 and 924 of semiconductor core 904. In the example of FIGS. 9A and 9B, source contact 912 and drain contact 914 are positioned on a side (e.g., top side shown in FIGS. 9A and 9B) of nanowire 902 opposite that of second gate region 910 (e.g., bottom side of nanowire 902 as shown in FIGS. 9A and 9B).

A dielectric material 926 separates source and drain contacts 912 and 914 from ring shaped gate region 908.

Figure 10:
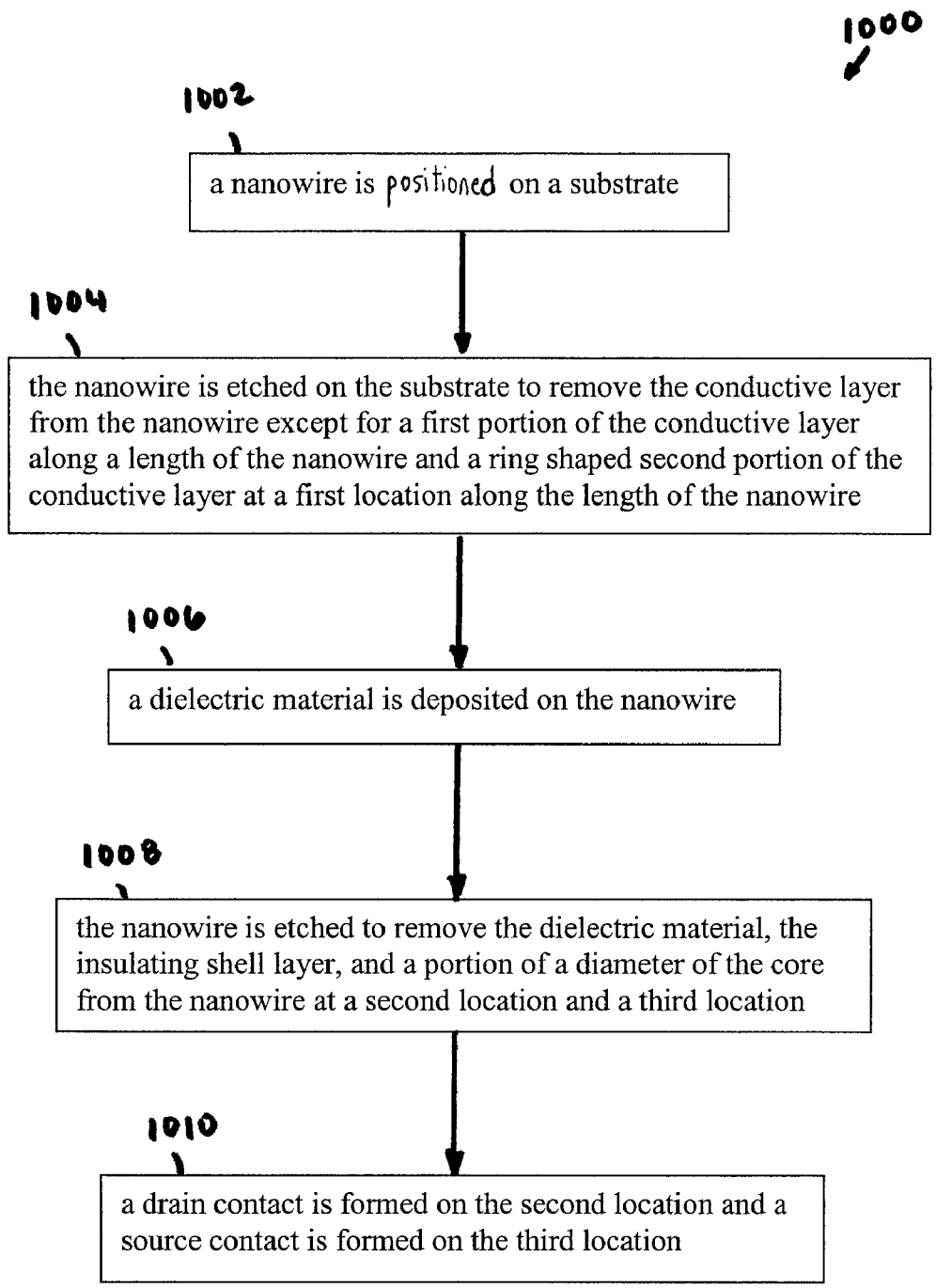
FIG. 10 shows a flowchart providing example steps for fabricating the electronic device of FIGS. 9A and 9B, according to an example embodiment of the present invention.

Electronic device 900 can be formed according to various processes, according to embodiments of the present invention. FIG. 10 shows a flowchart 1000 providing example steps for fabricating electronic device 900, according to an example embodiment of the present invention. Other structural and operational embodiments will be apparent to persons skilled in the relevant art(s) based on the following discussion. The steps shown in FIG. 10 do not necessarily have to occur in the order shown. The steps of FIG. 10 are described in detail below with regard to FIGS. 11-21. FIGS. 11-21 show various views of electronic device 900 during the example fabrication process, according to embodiments of the present invention.

Figure 11:
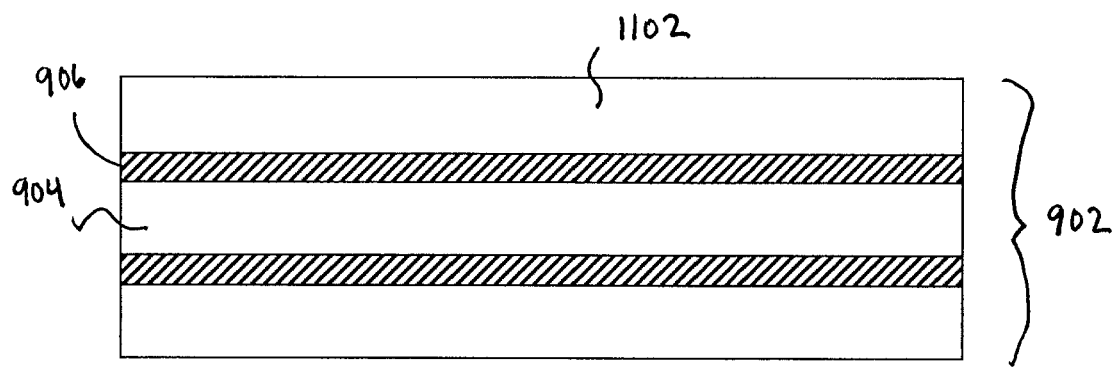
FIGS. 11-21 show various views of the electronic device of FIGS. 9A and 9B during an example fabrication process, according to embodiments of the present invention.
Figure 12:
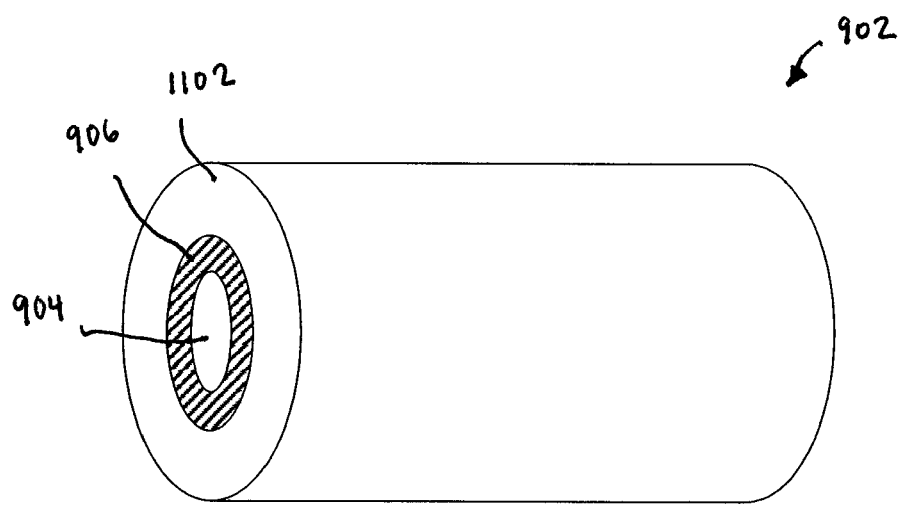
Figure 13:
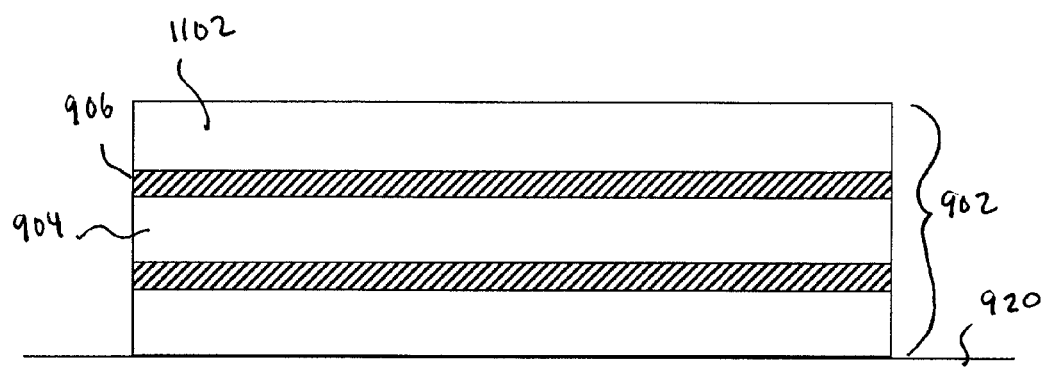

Flowchart 1000 begins with step 1002. In step 1002, a nanowire is positioned (e.g., deposited) on a substrate. For example, the nanowire is nanowire 902 positioned (e.g., grown, deposited, etc.) on substrate 920, as shown in FIG. 13. FIG. 11 shows an example cross-sectional view of nanowire 902, and FIG. 12 shows an example perspective view of nanowire 902. In an embodiment, such as shown in FIGS. 11 and 12, nanowire 902 has semiconductor core 904, insulating shell layer 906 surrounding core 904, and a conductive layer 1102 surrounding insulating shell layer 906. Conductive layer 1102 is a conformal coating formed around nanowire 902. For example, polycrystalline silicon (poly-Si) or Ge can be used as conductive layer 1102, or other conductive material can be used, such as another organic (e.g. conductive polymer, etc.) or inorganic material (e.g doped Si, Ge, etc) or a metal (e.g. W, Pt, Cu, Al, Ni, Ti, etc.), including a combination of metals/alloy. Conductive layer 1102 can be formed by chemical vapor deposition (CVD) techniques, such as plasma enhanced CVD (PECVD), low pressure CVD (LPCVD), atomic layer deposition (ALD), or rapid thermal CVD (RT-CVD), etc., by physical vapor deposition (PVD) (e.g., sputtering, e-evaporation), and by other thin film processing methods such as spin coating, vapor coating, immersion coating, etc. Insulating shell layer 906 can be formed of any of a variety of dielectric materials, such as SiO, SiN, SiON, SiC, AlO, AlN, etc., a polymer material, or other insulating material. In an example embodiment provided for illustrative purposes, conductive layer 1102 can have a thickness of 1000 Angstroms, shell layer 906 (e.g., made of SiO) can have a thickness of 100 Angstroms, and core 904 (e.g., when silicon) can have a 500 Angstrom diameter. Note that the relative dimensions for core 904, shell layer 906, conductive layer 1102, etc., shown in FIGS. 9 and 11-22 are not necessarily proportionally accurate, but are shown as they are for ease of illustration.

In an embodiment, flowchart 1000 can include the step where shell layer 906 is formed in/on core 904. Flowchart 1000 can also include the step where conductive layer 1102 is formed on shell layer 906.

Figure 14:
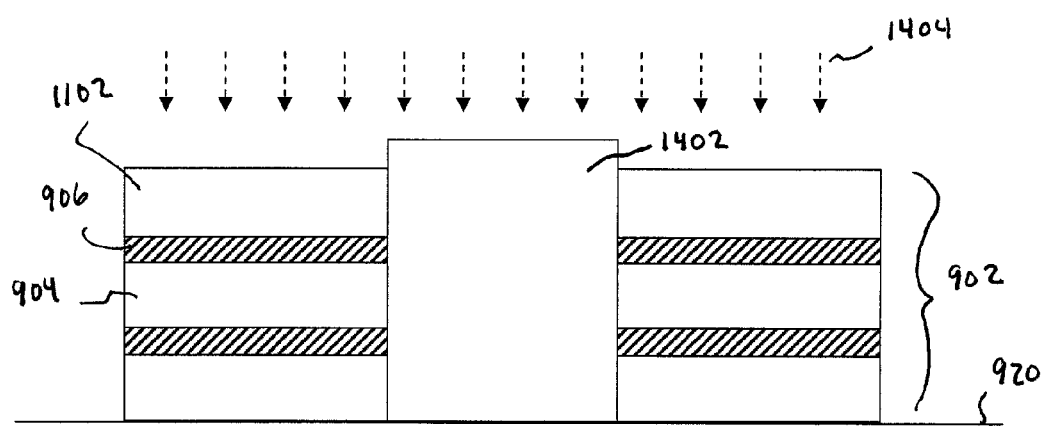

In step 1004, the nanowire is etched on the substrate to remove the conductive layer from the nanowire except for a first portion of the conductive layer along a length of the nanowire on a side opposite from the etching and a ring shaped second portion of the conductive layer around the nanowire at a first location along the length of the nanowire. For example, FIG. 14 shows an example etching of nanowire 902, according to an embodiment of the present invention. A portion of conductive layer 1102 can be selectively etched from nanowire 902 in any manner. As shown in the example of FIG. 14, a photoresist material 1402 can be patterned on nanowire 902 to protect portions of conductive layer 1102 on nanowire 902 that are not to be removed. A photolithography process can be used, for example. As shown in FIG. 14, nanowire 902 can be exposed or treated with an etching source 1404 (e.g., chemical etching material, laser light, etc.) to remove unprotected portions of conductive layer 1102. Any type of suitable material removal process can be used. For example, reactive ion etching (RIE) or other etching technique can be used. For example, in RIE etching processes, the plasma power, pressure, etching gas composition, and/or the substrate bias can be tuned such that the ion beam will be more direct towards the surface. Also a high etching selectivity between conductive layer 1502 and underlying insulating shell 906 is used so that the etching of the insulating layer 906 is minimized during the conductive layer 1502 etching. This can be accomplished, for example, by tuning the etching processes as described above.

Figure 15:
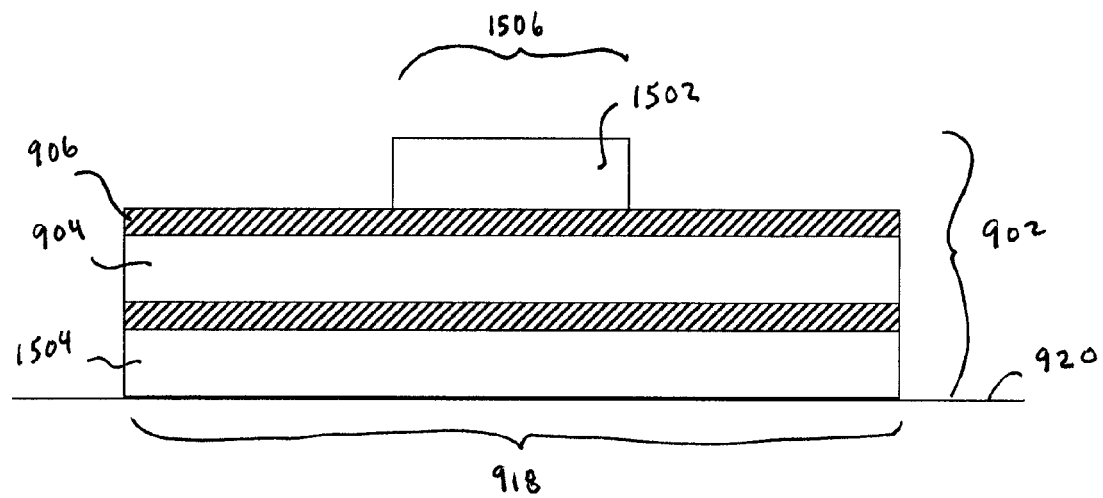
Figure 16:
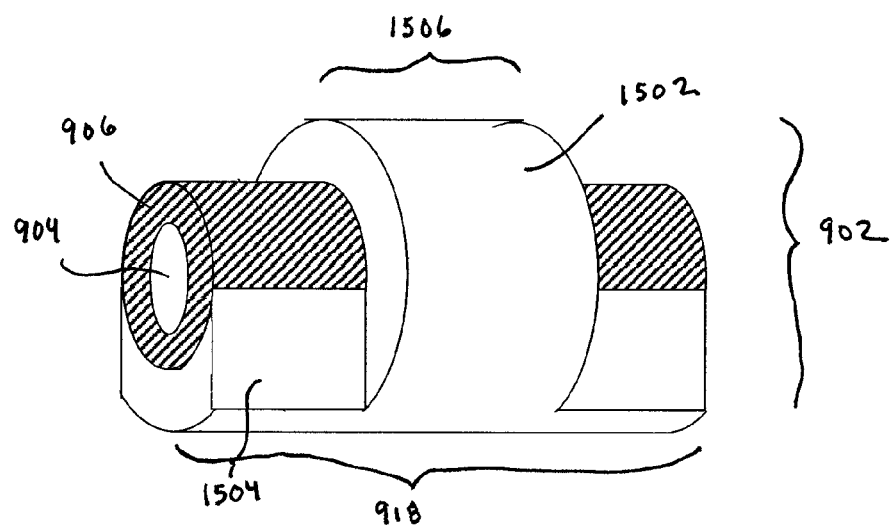

This removal of a portion of conductive layer 1102 forms an initial gate structure for electronic device 900. FIG. 15 shows an example cross-sectional view and FIG. 16 shows an example perspective view of nanowire 902 with an initial gate structure. As shown in FIGS. 15 and 16, the initial gate structure includes a ring shaped first region or portion 1502 of conductive layer 1102 and a second region or portion 1504 of conductive layer 1102. Ring shaped first portion 1502 forms a first, "front" gate, and second portion 1504 forms a second, "back" gate for electronic device 900. Ring shaped first portion 1502 of conductive layer 1102 is positioned around nanowire 902 at a first location 1506 (?) along length 918 of nanowire 902. Ring shaped first portion 1502 is shaped by photoresist material 1402 as described above, or by other means. Second portion 1504 of conductive layer 1102 is positioned along length 918 of nanowire 902. Second portion 1504 is formed in conductive layer 1102 on a side opposite from the etching source (e.g., light 1402), because core 904 and shell layer 906 block the etching source from affecting material under nanowire 902.

In an embodiment, as shown in FIG. 16, ring shaped first portion 1502 entirely encircles nanowire 902. Alternatively, first portion 1502 can be formed to partially encircle nanowire 902. In other words, in an embodiment, first portion 1502 is a partial circle, such as a half circle or other portion, that does not extend around the entire circumference of nanowire 902. Note that ring shaped first portion 1502 can be formed to have any width along nanowire 902, as required by a particular application.

In an embodiment, an optional doping step can be performed to dope the source and drain regions if desired. Any doping technique can be used. For example, the doping can be performed using thermal diffusion, ion implantation, laser induced doping, plasma ion immersion, or plasma ion showering, followed by thermal annealing, such as rapid thermal annealing (RTA) and laser annealing, etc.

Figure 17:
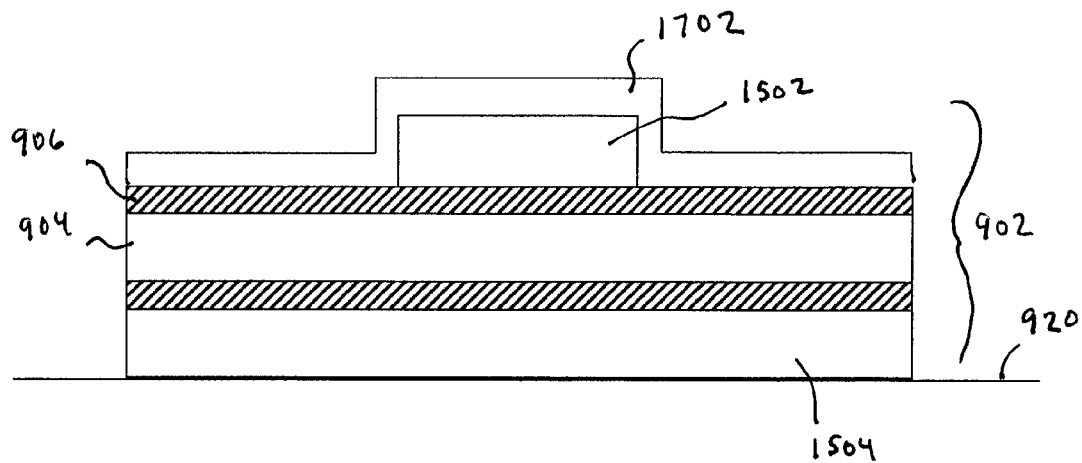
Figure 18:
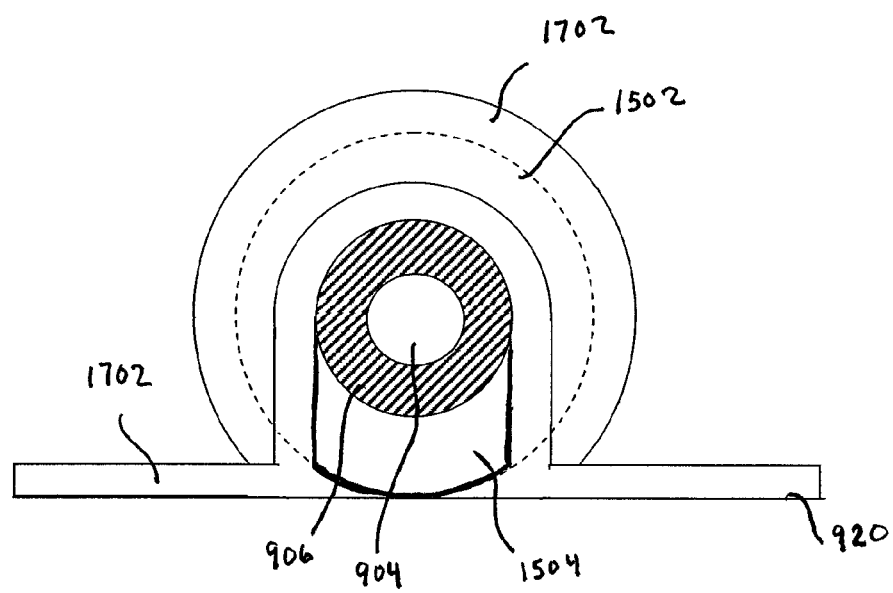

In step 1006, a dielectric material is deposited on the nanowire on the substrate. For example, the dielectric material is deposited to form dielectric material layer 1702, as shown in FIGS. 17 and 18. FIG. 17 shows a cross-sectional side view, and FIG. 18 shows an end view of nanowire 902. Dielectric material layer 1702 is used as a basis for an insulator between the eventual gate and drain/source contacts. Any type of dielectric material deposition process can be used, including vapor deposition, such as chemical vapor deposition (CVD), or atomic layer deposition (ALD). The dielectric material for layer 1702 can be any type of dielectric material, including $SiO_2$, SiN, $Al_2O_3$, AlN, or other dielectric material described or referenced elsewhere herein, or otherwise known. Alternatively, other deposition techniques and materials can be used, including spin on glass, spin on polymer (e.g., polyimide, BCB, SU8), and perelyne. In an embodiment, these materials are conformally coated on the nanowire, and planarized.

Figure 19:
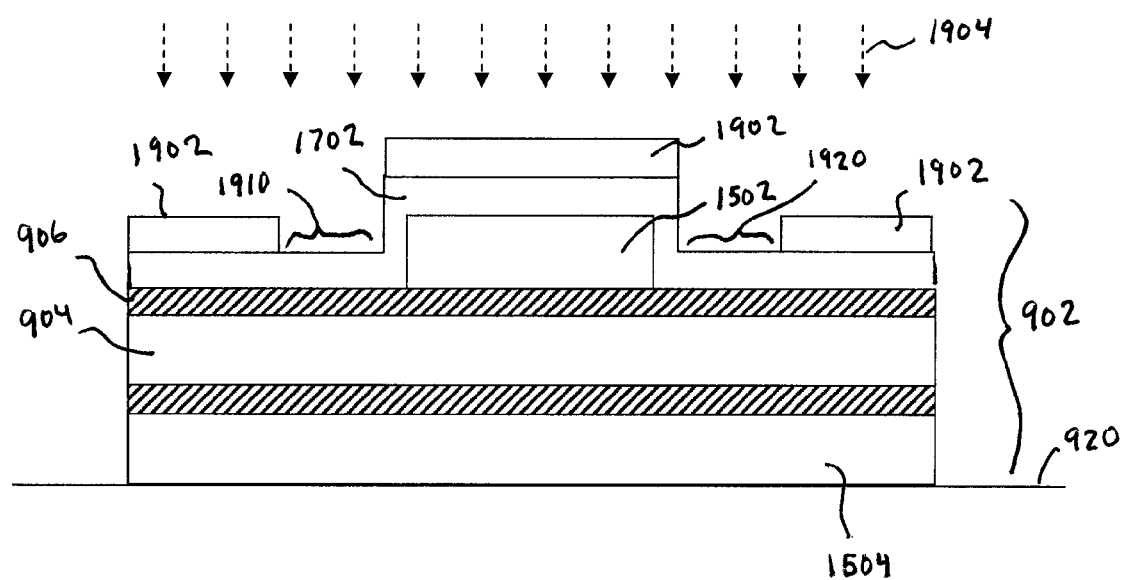
Figure 20:
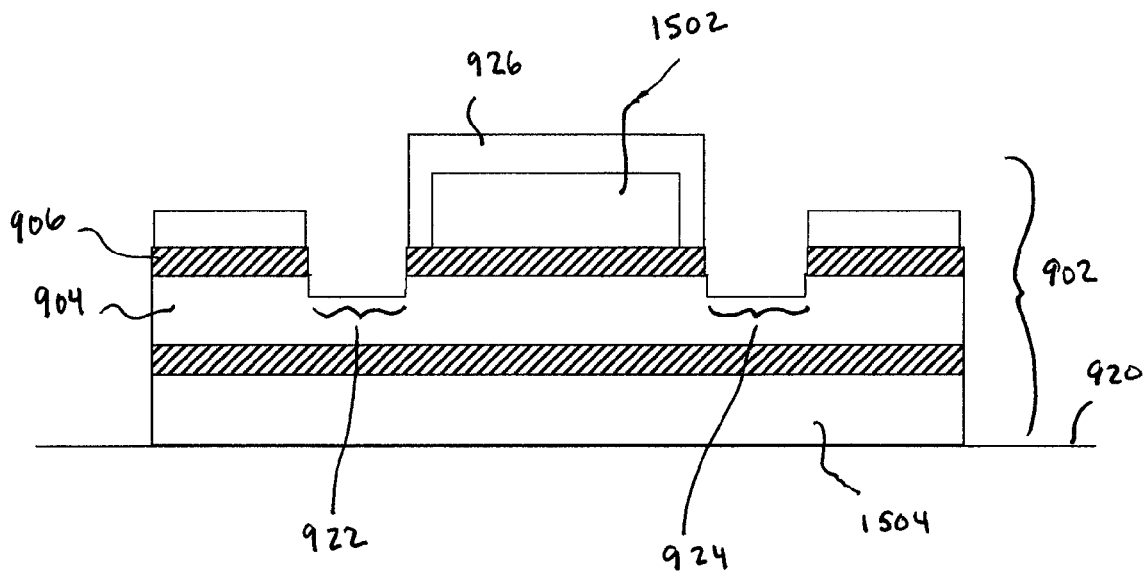
Figure 21:
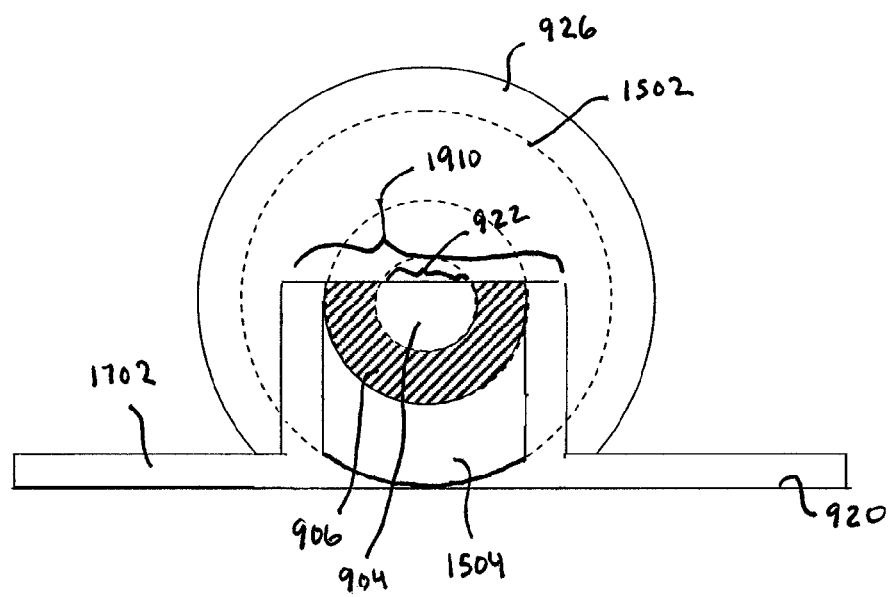

In step 1008, the nanowire is etched to remove the dielectric material, the insulating shell layer, and a portion of a diameter of the core from the nanowire at a second location and a third location along the length of the nanowire. For example, as shown in FIG. 19, a photoresist material 1902 can be patterned on dielectric material layer 1702 to control which portions of dielectric material layer 1702, shell layer 906, and core 904 are to be removed. A photolithography process can be used, for example. As shown in FIG. 19, nanowire 902 can be exposed or treated with an etching source 1904 (e.g., chemical etching material, reactive ion etching, etc.) to remove unprotected portions of dielectric material layer 1702, shell layer 906, and core 904. A first location 1910 and a second location 1920 shown in FIG. 19 are not protected by photoresist material 1902. Thus, as shown in the cross-sectional side view of FIG. 20, dielectric material layer 1702, shell layer 906, and core 904 are removed in first and second locations 1910 and 1920 to expose portions 922 and 924 of core 904. FIG. 21 shows an end cross-sectional view, showing dielectric material layer 1702, shell layer 906, and core 904 removed in first location 1910 to expose portion 922 of core 904. As shown in FIG. 20, dielectric material 926 of dielectric material layer 1702 covers ring shaped first portion 1502.

Alternatively, other material removal/etching techniques can be used, such as a planarization process, to remove dielectric material layer 1702, shell layer 906, and core 904 in first and second locations 1910 and 1920. For example, etching may be performed, such as plasma dry etching. The process can be tuned by varying the gas ratio and/or gas pressure such that the etch selectivity between the material of core 904 (e.g., silicon) and the material of dielectric material layer 1702 is substantially equal, to leave the surface in the contact areas (e.g., first and second exposed portions 922 and 924) substantially flat and smooth, such as shown in FIG. 21. In some embodiments, a very high etch selectivity between a silicon core and the dielectric material is desirable, which can be realized when polymer-based materials are used for the dielectric material, for example.

As described above, in an embodiment, some of core 904 is removed during step 1008. For example, ¼ to ⅓ of the diameter of core 904 can be removed, or any other amount. In another embodiment, during step 1008, dielectric material layer 1702 and shell layer 906 are etched to expose the surface of core 904, without removing material from core 904.

In step 1010, a drain contact is formed on the second location and a source contact is formed on the third location.

For example, as shown in FIGS. 9A and 9B, source contact 912 and drain contact 914 are formed in first and second exposed portions 922 and 924. For example, metal deposition/metallization can be performed to form source contact 912 and drain contact 914. Photoresist may be used to cover areas that are not to be metallized, and the photoresist can subsequently be removed, for example.

Thus, in an embodiment, electronic device 900 can be formed by the process of flowchart 1000. Ring shaped first portion 1502 formed from conductive layer 1102 is ring shaped first gate region 908 of electronic device 900. Second portion 1504 formed from conductive layer 1102 is second gate region 910.

Figure 22:
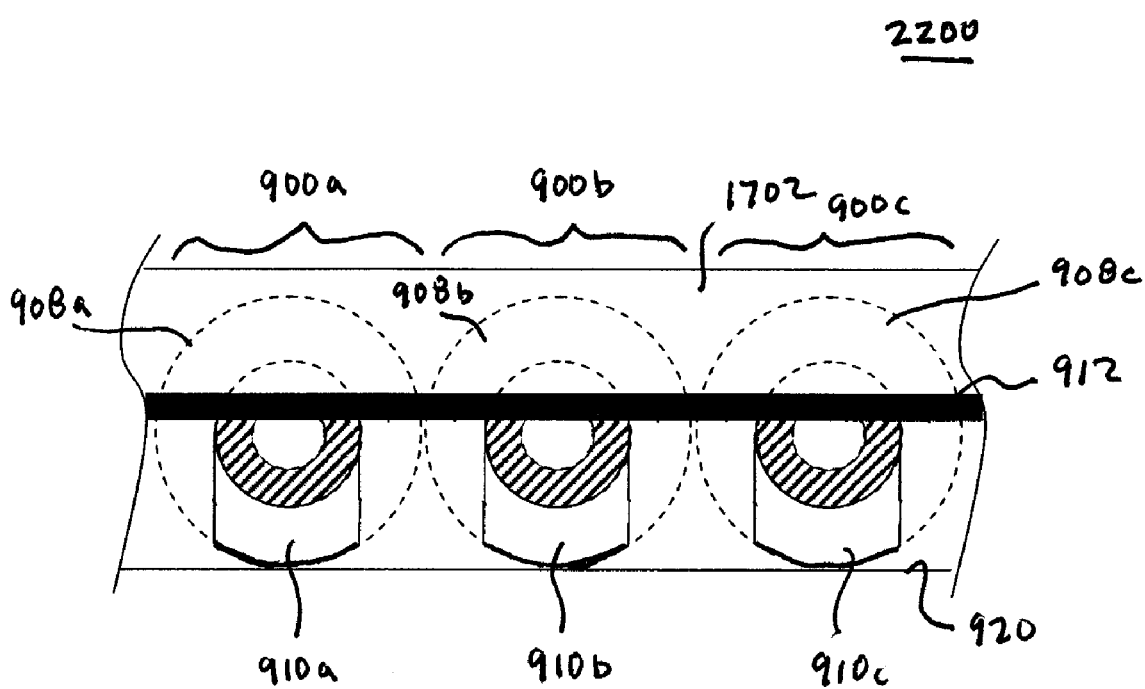
FIG. 22 shows an electronic device having a plurality of nanowires each having an asymmetrical double gate configuration, according to an example embodiment of the present invention.

In an embodiment, the nanowire positioned in step 1002 is positioned with a plurality of nanowires. In such an embodiment, steps 1004, 1006, 1008, and 1010 can be performed on the plurality of nanowires to form the electronic device. Thus, a plurality of nanowires similar to nanowire 902 can be positioned, aligned or non-aligned, to form an electronic device. For example, FIG. 22 shows an end cross-sectional view of a portion of an electronic device 2200, that includes a plurality of electronic devices 900*a-c*. Note that each of electronic devices 900*a-c* have a respective ring shaped first gate region 908*a-c* and second gate region 910*a-c*. These gates can be electrically coupled together thru traces/circuitry of substrate 920, or otherwise. Furthermore, a common source contact 912 is coupled to each core of electronic devices 900*a-c*.

Note the description above for electronic device structures and processes for fabrication thereof can also be applied to amorphous silicon (a-Si) and to poly-silicon (poly-Si) based thin film transistors.

Figure 23:
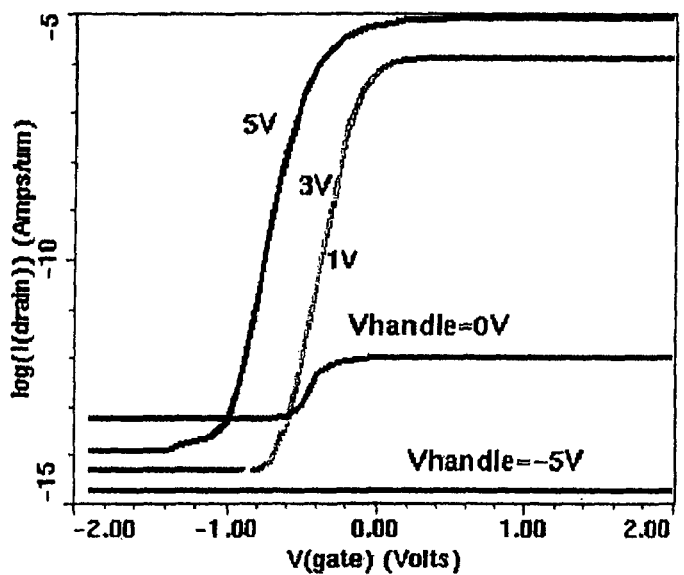
FIG. 23 shows a plot of simulation results for an electronic device with asymmetrical gate structure, according to an example embodiment of the present invention.

FIG. 23 shows a plot 2300 of simulation results for an n-channel device embodiment of the present invention. Plot 2300 shows various plots of drain current Id (Y-axis) (e.g., current measured at drain contact 914 of FIGS. 9A and 9B) versus gate voltage V(gate) X-axis) (e.g., voltage applied to ring shaped first gate region 908), as the back gate voltage is varied (e.g., voltage applied to second gate region 910, Vhandle). In FIG. 23, the back gate voltage is varied in steps: −5 V, 0 V, 1 V, 3 V, and 5 V.

Plot 2300 indicates that as the back gate voltage is varied upwards from 0 Volts (i.e., Vhandle≠0), the drain current is dramatically increased. Thus, the use of a back gate, such as second gate region 908, allows for increased current capacity.

Figure 24:
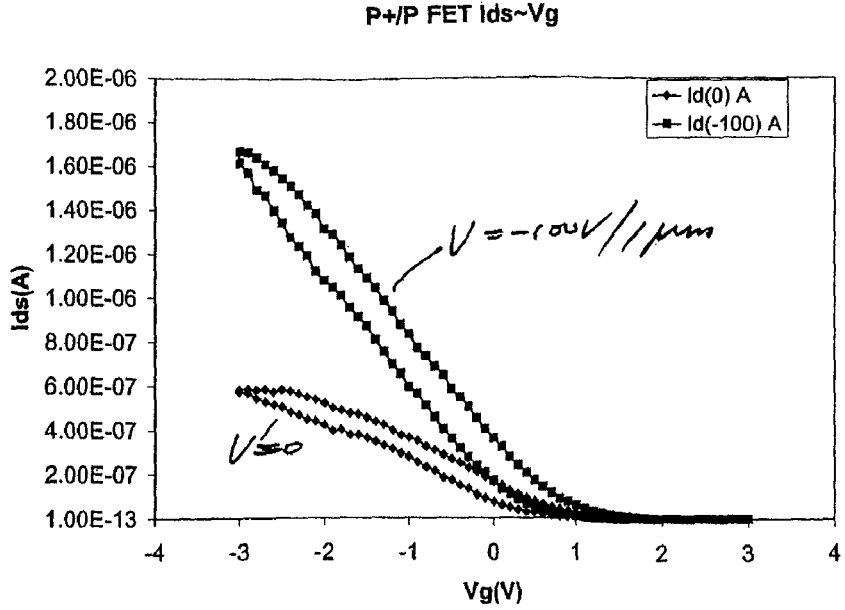
FIG. 24 shows a plot of actual operational results for an electronic device with asymmetrical gate structure, according to an example embodiment of the present invention.

FIG. 24 shows a plot 2400 of results from an actual p-channel device, showing similar results to the simulation of FIG. 23. In plot 2400, back gate voltages of 0 V and −100V are used. As shown in plot 2400, a non-zero back gate voltage offers increase current capacity (i.e., about 3× more current shown in plot 2400).

Thus, embodiments of the present invention provide many benefits, including:

A. High current drive ability;

B. Low series resistance;

C. Ohmic contact without doping; and

D. For nanowire applications, a completely low fabrication/assembly environment temperature (e.g., T<200°) is possible, without sacrificing performance.

CONCLUSION

While various embodiments of the present invention have been described above, it should be understood that they have been presented by way of example only, and not limitation. It will be apparent to persons skilled in the relevant art that various changes in form and detail can be made therein without departing from the spirit and scope of the invention. Thus, the breadth and scope of the present invention should not be limited by any of the above-described exemplary embodiments, but should be defined only in accordance with the following claims and their equivalents.

What is claimed is:

1. A method for fabricating an electronic device, comprising:
   (a) providing a nanowire having a semiconductor inner portion, an insulating shell layer surrounding the core, and a conductive layer surrounding the insulating shell layer;
   (b) removing the conductive layer from the nanowire except for a first portion of the conductive layer at least partially encircling the nanowire at a first location along the length of the nanowire and at least a second portion of the conductive layer along a length of the nanowire on a side opposite from the removing;
   (c) positioning a dielectric material on the nanowire;
   (d) removing the dielectric material and the insulating shell layer from the nanowire at a second location and a third location along the length of the nanowire, wherein the second location and the third location are on opposite respective sides of the first location along the length of the nanowire, wherein at least one of the second location and the third location overlaps with the second portion of the conductive layer along the length of the nanowire; and
   (e) forming a source contact on the second location and a drain contact on the third location.

2. The method of claim 1, further comprising:
   positioning the nanowire on a substrate prior to step (b).

3. The method of claim 1, wherein step (d) further comprises:
   removing a portion of the diameter of the semiconductor inner portion from the nanowire at the second and third locations.

4. The method of claim 3, wherein step (d) comprises:
   applying a photoresist material to the nanowire at least at the first location;
   using etching to remove the dielectric material, the insulating shell layer, and a portion of the diameter of the semiconductor inner portion from the nanowire at the second and third locations.

5. The method of claim 3, wherein the removing of step (d) comprises:
   planarizing the dielectric material, the insulating shell layer, and a portion of the semiconductor inner portion from the nanowire at the second and third locations.

6. The method of claim 1, wherein the semiconductor inner portion is a semiconductor core.

7. The method of claim 1, further comprising:
   depositing the nanowire on a substrate prior to step (b).

8. The method of claim 1, wherein the nanowire is one of a plurality of nanowires deposited on the substrate, each nanowire having a semiconductor inner portion, an insulating shell layer surrounding the core, and a conductive layer surrounding the insulating shell layer;
   wherein steps (b)-(e) are performed on the plurality of nanowires to form the electronic device.

9. The method of claim 8, wherein two or more of the plurality of nanowires share a common source contact and/or drain contact.

10. The method of claim 8, further comprising:
    coupling the conductive layers of two or more of the plurality of nanowires.

11. The method of claim 1, wherein step (b) comprises:
    applying a photoresist material to the nanowire at least at the first location; and
    using etching to remove the conductive layer from the nanowire except for at the first portion and the second portion of the conductive layer.

12. The method of claim 1, wherein step (d) comprises:
    applying a photoresist material to the nanowire at least at the first location;
    using etching to remove the dielectric material and the insulating shell layer from the nanowire at the second and third locations.

13. The method of claim 1, wherein the removing of step (b) and/or step (d) comprises:
    using reactive ion etching.

14. The method of claim 13, wherein said using reactive ion etching comprises:
    tuning at least one of a plasma power, plasma pressure, etching gas composition, and substrate bias to adjust an ion beam.

15. The method of claim 1, wherein the positioning a dielectric material on the nanowire of step (c) comprises:
    using vapor deposition.

16. The method of claim 1, wherein the positioning a dielectric material on the nanowire of step (c) comprises at least one of using a spin-on glass process, using a spin-on polymer process, and applying perelyne.

17. The method of claim 1, wherein the removing of step (b) and/or step (d) comprises:
    using plasma dry etching.

18. The method of claim 17, wherein said using plasma dry etching comprises:
    tuning at least one of a gas ratio and a gas pressure to control etching.

19. The method of claim 1, wherein step (e) comprises:
    metallizing the second location and the third location to form the drain contact and source contact, respectively.

20. The method of claim 1, further comprising:
    prior to step (e), doping the semiconductor inner portion at the second location and/or the third location.

21. A method for fabricating an electronic device, comprising:
    (a) providing a nanowire having a semiconductor inner portion, an insulating shell layer surrounding the core, and a conductive layer surrounding the insulating shell layer;
    (b) selectively removing the conductive layer from the nanowire except for a first portion of the conductive layer at least partially encircling the nanowire at a first location along the length of the nanowire and at least a second portion of the conductive layer along a length of the nanowire on a side opposite from the removing;
    (c) removing the insulating shell layer from the nanowire at a second location and a third location along the length of the nanowire, wherein the second location and the third location are on opposite respective sides of the first location, wherein at least one of the second location and the third location overlaps with the second portion of the conductive layer along the length of the nanowire; and
    (e) forming a source contact on the second location and a drain contact on the third location.

* * * * *